(12) United States Patent
Park et al.

(10) Patent No.: US 8,222,745 B2
(45) Date of Patent: Jul. 17, 2012

(54) INTEGRATED HEAT SINK

(75) Inventors: Sangjune Park, Colorado Springs, CO (US); Carl Iwashita, San Jose, CA (US)

(73) Assignee: LSI Corporation, Milpitas, CA (US)

(*) Notice: Subject to any disclaimer, the term of this patent is extended or adjusted under 35 U.S.C. 154(b) by 368 days.

(21) Appl. No.: 12/689,806

(22) Filed: Jan. 19, 2010

(65) Prior Publication Data

US 2011/0176278 A1    Jul. 21, 2011

(51) Int. Cl.
    *H01L 23/48* (2006.01)
(52) U.S. Cl. .......................................... 257/773; 257/11
(58) Field of Classification Search .................. 257/773, 257/E23.011, E21.567
    See application file for complete search history.

(56) References Cited

U.S. PATENT DOCUMENTS

| | | | |
|---|---|---|---|
| 5,640,137 A | 6/1997 | Mantha | |
| 5,930,587 A | 7/1999 | Ryan | |
| 6,407,445 B1 | 6/2002 | Vashchenko et al. | |
| 6,747,445 B2 | 6/2004 | Fetterman et al. | |
| 6,777,784 B1 | 8/2004 | Vashchenko et al. | |
| 7,196,377 B2 | 3/2007 | Kodama et al. | |
| 7,253,074 B2 | 8/2007 | Park | |
| 7,327,029 B2 | 2/2008 | Archer, III et al. | |
| 7,339,274 B2 | 3/2008 | Desko, Jr. et al. | |
| 7,429,502 B2 | 9/2008 | Archer, III et al. | |
| 7,439,146 B1 | 10/2008 | Krutsick | |
| 2008/0032467 A1 | 2/2008 | Vashchenko et al. | |
| 2011/0027968 A1* | 2/2011 | Yamazaki et al. | 438/458 |
| 2011/0207265 A1* | 8/2011 | Kwon et al. | 438/122 |

* cited by examiner

*Primary Examiner* — Victor A Mandala
*Assistant Examiner* — Krista Soderholm (57) ABSTRACT

An electronic device includes a heat dissipating component located over a substrate. An isolation trench is formed in the substrate adjacent the component. A contact region of the substrate is bounded by the trench. An electrically isolated contact is located over and in contact with the contact region. The electrically isolated contact and the contact region provide a thermally conductive path to the substrate.

20 Claims, 11 Drawing Sheets

FIG. 7

INTEGRATED HEAT SINK

TECHNICAL FIELD

This application is directed, in general, to an electronic device, and, more specifically, to dissipating heat in an electronic device.

BACKGROUND

Electromigration is a significant reliability issue in integrated circuit interconnects. Diffusion of metal atoms within a circuit trace that is conducting current may cause the line to narrow near a grain boundary in the metal. The diffusion kinetics are typically heat-dependent, with an increase of temperature leading to a greater rate of diffusion. Thus, a metal line operating at a higher temperature may experience a reduced lifetime relative to the line operating at a lower temperature.

Some integrated circuits, CPUs e.g., are commonly attached to a heat sink to reduce the operating temperature thereof. While this approach may reduce the mean operating temperature of a device, a localized source of power dissipation on the device die may lead to locally greater temperature than average. This greater temperature places interconnects near the source at risk of early failure from electromigration.

SUMMARY

One aspect provides an electronic device. The device includes a heat-dissipating component located over a substrate. An isolation trench formed in the substrate is located adjacent the component. A contact region of the substrate is bounded by the trench. An electrically isolated contact is located over and in contact with the contact region. The electrically isolated contact and the contact region provide a thermally conductive path to the substrate.

Another aspect provides a method of forming an electronic device. The method includes providing a substrate having a heat-dissipating component located thereover and an isolation trench adjacent the component. A contact region of the substrate is bounded by the trench. An electrically isolated contact is located over and in contact with the contact region. The electrically isolated contact and the contact region provide a thermally conducting path to the substrate.

BRIEF DESCRIPTION

Reference is now made to the following descriptions taken in conjunction with the accompanying drawings, in which.

DETAILED DESCRIPTION

The disclosure benefits from the recognition that heat may be transported from a localized source of power dissipation, or "hot spot," to cooler portions of an electronic device using a heat sink formed from interconnect elements. In particular, the temperature rise in a portion of the device proximate a heat-dissipating component, e.g., a resistor, may be reduced using structures within the scope of the disclosure. The average lifetime of interconnect lines running near the component is advantageously increased by virtue of the lower temperature.

Figure 1A:
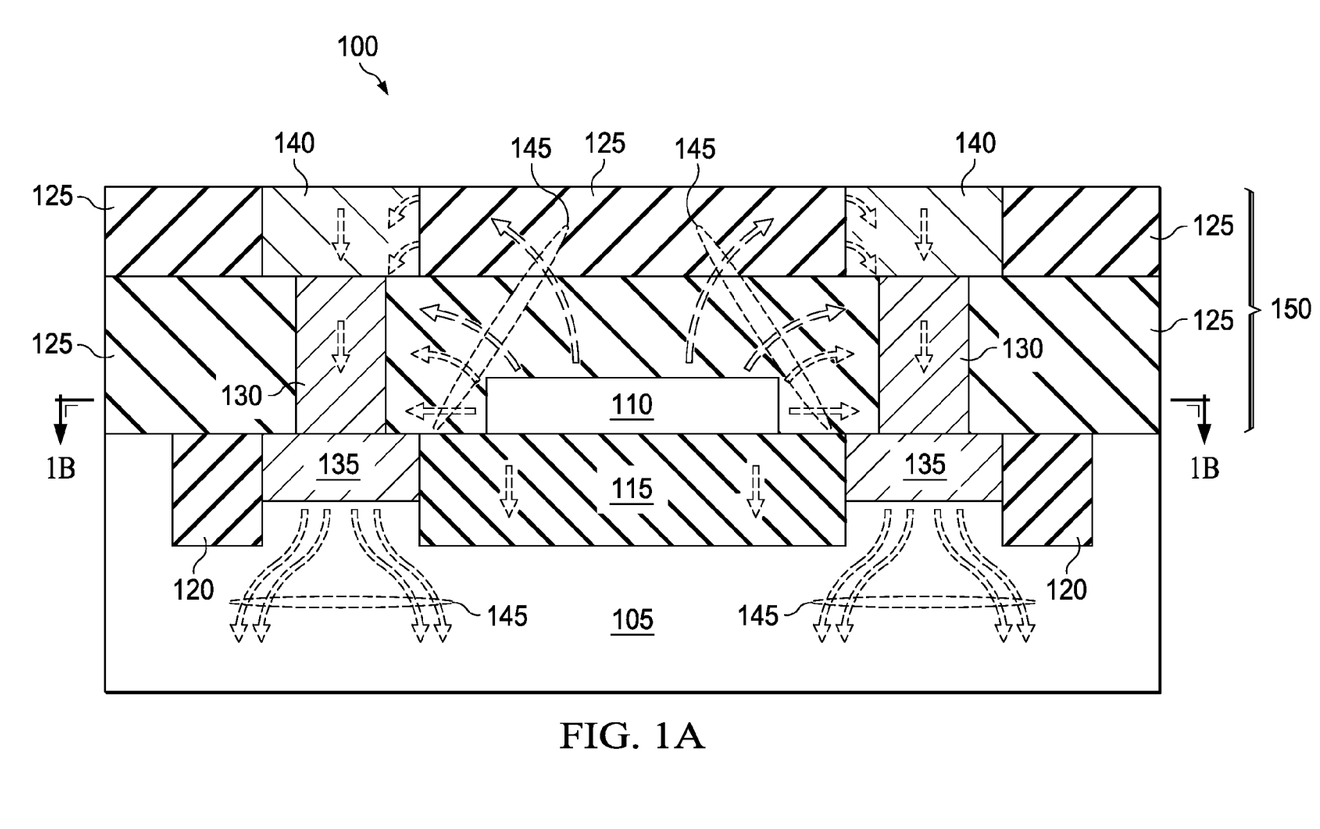
FIGS. 1A and 1B are front and top views, respectively, of an embodiment of the disclosure having a single contact.

FIG. 1A illustrates a front view of an embodiment of the disclosure, generally designated device 100. The device 100 includes a substrate 105 with a heat-dissipating component 110 formed thereover. The substrate 105 may be a portion of a semiconductor wafer or a semiconducting layer on a handle wafer. For instance, the substrate 105 may be any elemental or compound semiconductor material, such as Si, Ge, InP, GaAs, or CdTe. The handle wafer, if used, may be any substrate suitable for use as an integrated circuit (IC) substrate. In addition to the example semiconductor materials previously enumerated, a handle wafer may be an insulating material such as glass or crystalline sapphire, e.g. The substrate 105 typically will have a background dopant, such as for a p-type silicon wafer. However, embodiments herein are not limited to substrates with a background dopant.

The component 110 is configurable to dissipate power. The component may be, e.g., a passive resistor or a resistive portion of an active device such as a transistor. A passive resistor may be any resistive material currently known or later discovered that is compatible with IC manufacturing. In some embodiments, the component 110 is a metal-based resistor such as $MoSi_2$ or $CrSi_2$. In other embodiments, the component 110 is an elemental or compound semiconducting material, such as Si, Ge, or GaAs. Without limitation, it is recognized that passive resistors are often formed from polysilicon. When the component 110 is a portion of an active device, the component 110 may be, e.g., a drain region of a MOSFET configured to dissipate heat when the active device is operating. For brevity, the remainder of this discussion refers to the component 110 as the component 110 without further elaboration, recognizing that it may be a portion of an active device. Moreover, the component 110 is regarded herein and in the claims as heat-dissipating even when unpowered in recognition of its inherent heat-dissipating characteristics. Furthermore, while the embodiments presented may illustrate the component 110 located above a surface plane of a substrate, it is recognized that in some embodiments, e.g., an active device, the component 110 may be located within the substrate 105.

Isolation trenches 115, 120 are located within the substrate 105. The isolation trenches 115, 120 may be conventionally formed by creating trenches in the substrate 105 and filling the trenches with a dielectric such as $SiO_2$. The device 100 includes layers of dielectric 125 thereover. The dielectric layers may include any conventional or novel interconnect dielectric. Without limitation, examples include doped or intrinsic silicon oxide-based materials (e.g., plasma oxide, fluorine-doped oxide, phosphorous-doped oxide), barrier layers (e.g., SiN, SiC), and low-k materials (e.g., carbon-doped silicate, porous silicate and organic materials).

The device 100 includes electrically isolated contacts 130 located between contact regions 135 and interconnect metal portions 140. A contact is a vertical conductor that connects to the substrate 105. The contacts 130 may be, e.g., conventionally formed tungsten or aluminum. An interconnect metal portion is a trace or a via. A trace is a metal feature located at a level of the device 100 typically used for horizontal (e.g., parallel to the substrate 105) signal routing. A via is a metal feature located at a level of the device 100 typically used for vertical signal routing. The contacts 130 and the interconnect metal portions 140 may be formed of any conventional or future-developed interconnect metallization scheme. The metallization scheme may include, e.g., various barrier layers and siliciding of the portion of the contact regions 135 contacted by the contacts 130.

An electrically isolated contact is a contact that is not conductively coupled to an electrical signal path within the device 100. An electrical signal path, e.g. is a path that that includes a connection to an active device within the device 100. However, the contact, while being electrically isolated from signal paths, may be conductively coupled to and have a common potential with the substrate 105. Moreover, interconnect metal portions 140 conductively coupled to the contacts 130 may have a common potential with the substrate 105.

The electrically isolated contacts 130, interconnect metal portions 140 (when used) and the contact regions form a thermally conductive path to the substrate 105. Herein and in the claims, a thermally conductive path is a path that has relatively greater thermal conductivity than a medium surrounding the path. Thus, e.g., the contact 130, formed of a metal, has a lower thermal conductivity that the dielectric 125 surrounding the contact 130.

The contact regions 135 may be formed conventionally. As used in the description and the claims, a contact region is a region of the substrate 105 that includes that portion of the substrate 105 being directly connected to the contact 130, and a region of the substrate in immediate proximity to the contact 130 and doped similarly to the portion of the substrate being directly connected to the contact 130. The contact region 135 is also surrounded by an isolation region that isolates the contact region from other portions of the substrate 105. In some embodiments, the contact region 135 is a diffusion well, e.g., a region of the substrate 105 doped with a P or N type dopant in addition to any background dopant present in the substrate 105. The dopant polarity may be a same or a different dopant polarity as the background dopant. In other embodiments, the contact region 135 is not doped other than any background dopant of the substrate 105.

While the embodiment of FIG. 1A includes the interconnect metal portions 140, in other embodiments, the contacts 130 are present without connection to any interconnect metal portion. Such an unconnected contact is referred to as an isolated contact. While typical manufacturing design rules require that a contact be connected to an overlying interconnect metal feature, such a requirement is generally based on electrical yield concerns. Because thermal conduction, and not electrical yield, is the objective of the contacts 130, design rule constraints restricting the use of isolated contacts may be relaxed in some cases. Such use of an isolated contact is typically contrary to conventional practice, and may require a design rule exception by the manufacturer of the device 100.

Other contacts (not shown) typically connect the component 110 to other portions of a circuit formed over the substrate 105. Current flows through the component 110 when the circuit is operating, dissipating power in the form of heat proportional to $P=VI=I^2R$. Here, P is dissipated power, V is a voltage drop across the component 110, I is current therethrough, and R is resistance. In cases in which the current and/or the voltage and/or the resistance is sufficiently large, the dissipated power may cause a hot spot with a temperature significantly higher than the average temperature of the device 100. The maximum temperature of the hot-spot is determined in part by the thermal conductivity of the medium surrounding the component 110.

The component 110 is shown interposed between the two contact regions 135. Heat flux 145 is illustrated flowing from the component 110 into the dielectric 125. The interconnect metal portions 140 and the contacts 130 act to conduct the heat flux 145 to the substrate 105, thereby operating as a heat sink. For ease of reference, one or more interconnect metal portions 140 and one or more associated contacts 130 are collectively referred to as a heat sink 150. The substrate 105 presents a low thermal resistance to the heat flux 145, so the heat is dissipated into the bulk of the substrate 105. In some embodiments a macroscopic heat sink (not shown) may be attached to a package housing the device 100 to transfer the heat to the ambient. Because the heat flux 145 is conducted to the substrate 105, the temperature of the device 100 in the vicinity of the component 110 is lower than would be the case without the heat sink 150. Thus, signal-carrying interconnect lines routed near the component 110 are expected to operate at a lower temperature than they would in the absence of the heat sink 150. The lower operating temperature is expected to increase the mean operating life of the interconnects.

Figure 1B:
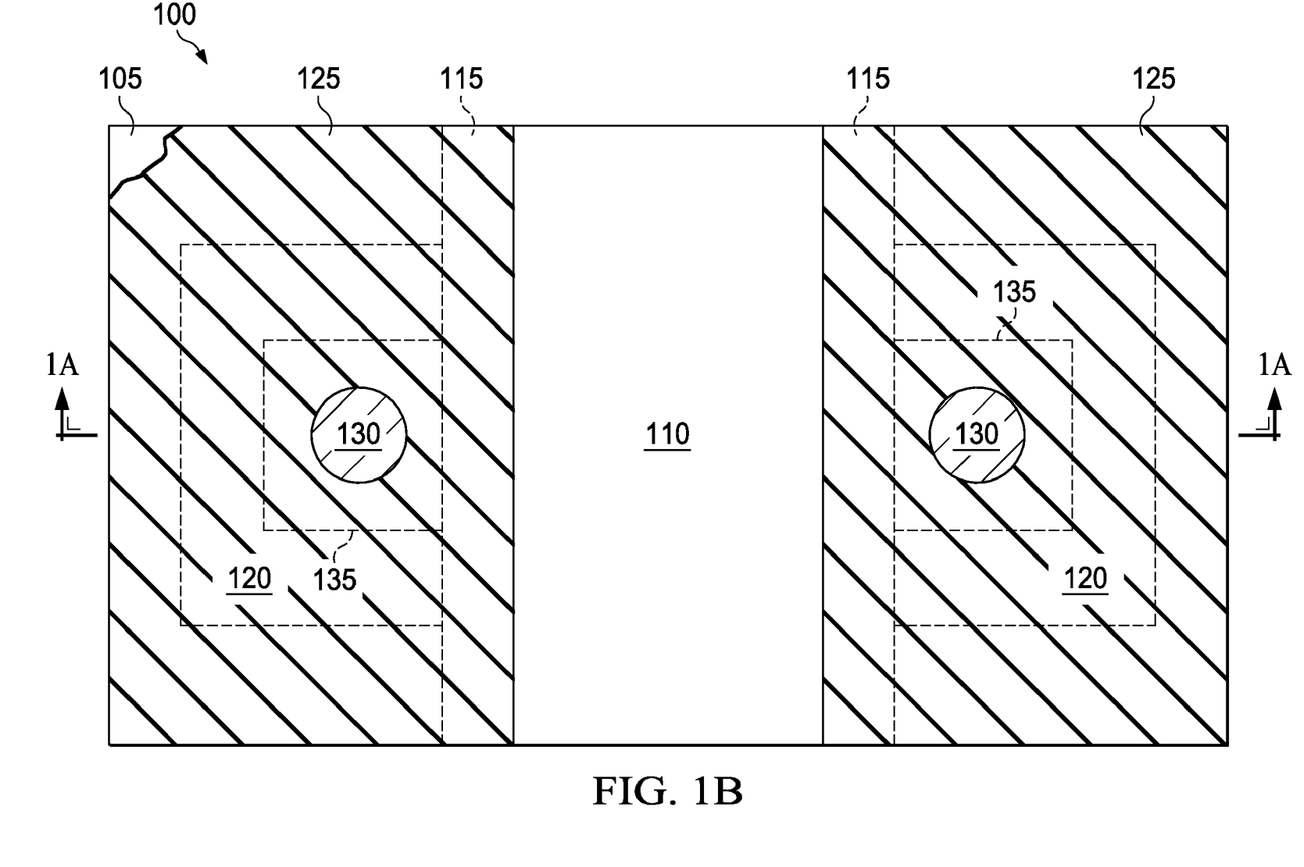

FIG. 1B illustrates a top view of the device 100 at the section indicated in FIG. 1A according to one embodiment. The isolation trenches 115, 120 are shown as separate structures for notational convenience. However, in some embodiments the isolation trenches 115, 120 form a single continuous structure. The isolation trenches 115, 120 bound the contact region 135. In some embodiments, as illustrated, the isolation trenches 115, 120 completely surround the contact region 135. Thus the contact region 135 is at least partially conductively isolated from other features of the device 100, e.g., other transistors. The contact 130 and the interconnect metal portion 140 are conductively isolated from interconnects used to carry signals in the device 100, so the heat sink 150 is conductively isolated from electrically active signal lines of the device 100.

Importantly, the configuration of the heat sink 150 differs from conventional approaches. Some conventional approaches either alter the physical layout of a heat-dissipating device or place the device in contact with a metal feature. In either of these cases, the heat-dissipating device is physically altered. Such alterations may reduce the reliability of the device or make the device operate in a different manner than the unperturbed analog. Embodiments herein conduct heat from the component 110 indirectly, e.g., by conducting heat directly from the dielectric 125. Thus, any perturbation of the component 110 is significantly reduced, and in many cases will be negligible.

Figure 2A:
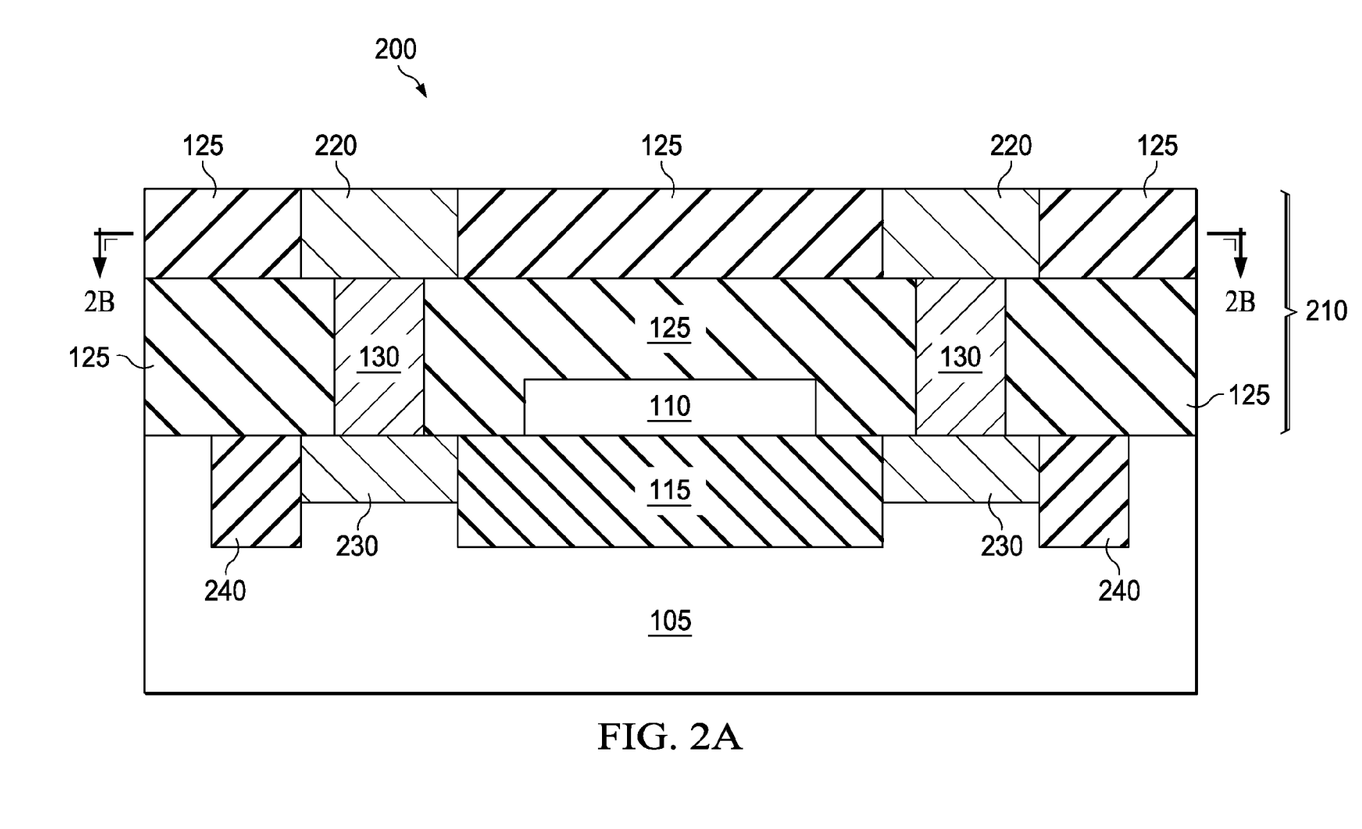
FIGS. 2A-2C depict an embodiment of the disclosure having a plurality of contacts.
Figure 2B:
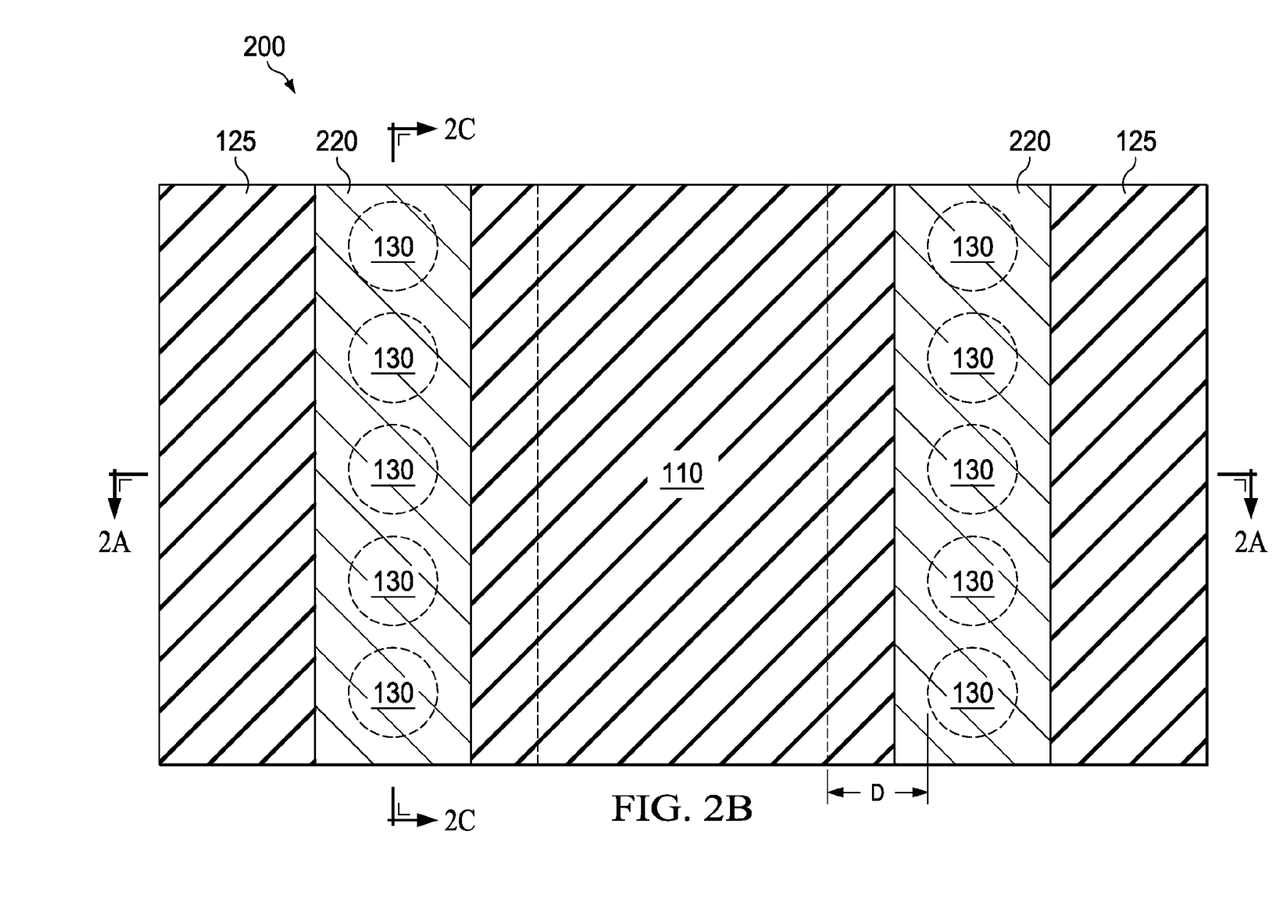
Figure 2C:
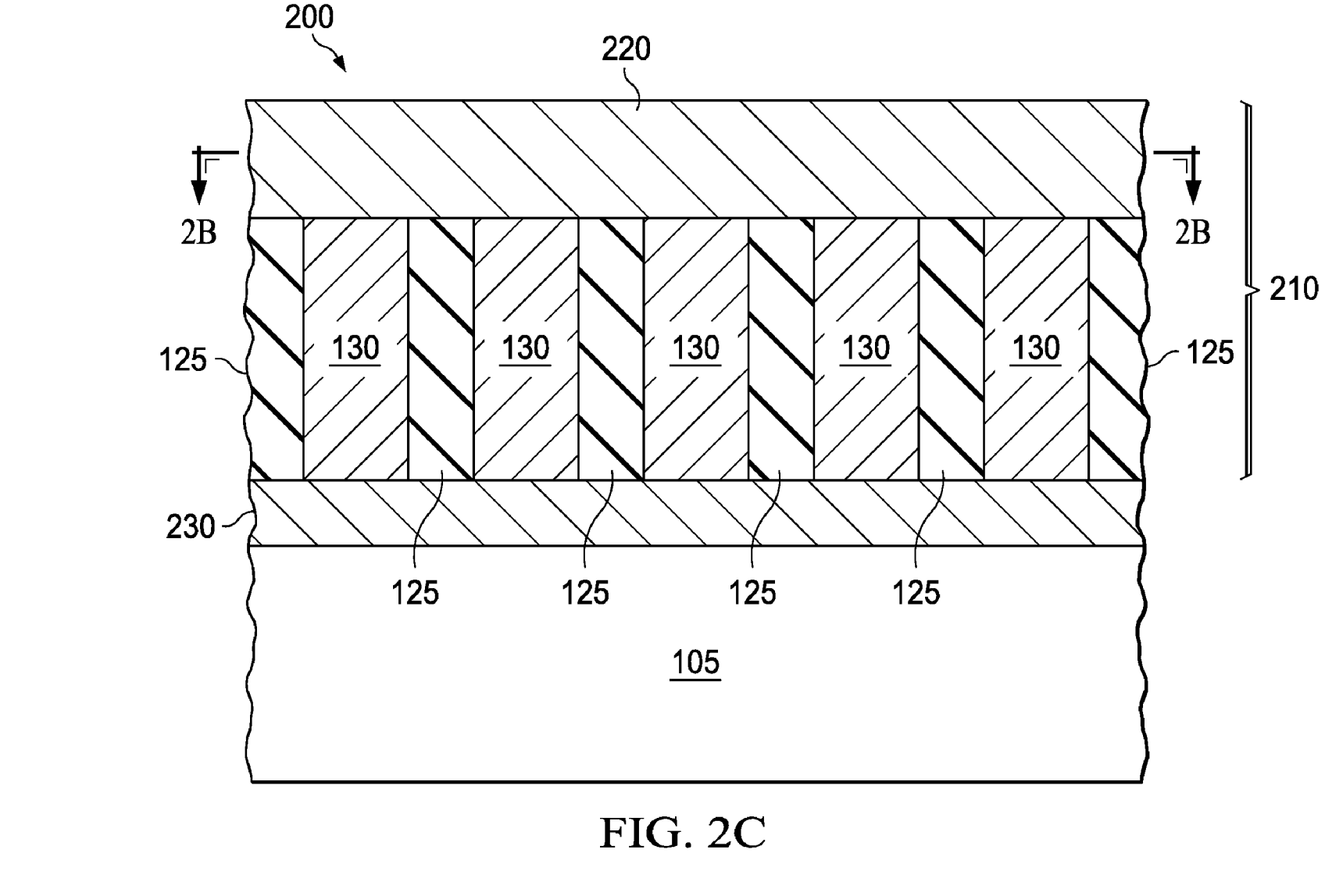

FIGS. 2A, 2B and 2C illustrate front, top and side views, respectively, of an embodiment of the disclosure generally designated device 200. A heat sink 210 is illustrated located over the component 110. The heat sink 210 includes a plurality of contacts 130 grouped as two sets. The component 110 is interposed between the two sets. The contacts 130 of each set are located between one of interconnect metal portions 220 and a corresponding one of contact regions 230. An isolation trench 240 and the isolation trench 115 insulate the contact region 230 from other circuit elements in the device 200, and may completely surround the contact region 230. The interconnect metal portions 220 and the contacts 130 form a "fence" adjacent the component 110 as illustrated in FIG. 2C. The fence structure is expected to more effectively conduct heat produced by the component 110 from the dielectric 125 to the substrate 105 than, e.g., the heat sink 150. The contacts 130 provide parallel paths for heat conducted from the interconnect metal portion 220 and the dielectric 125 to the substrate 105. The heat sink 210 may extend along a portion or an entirety of the component 110. In cases where the component 110 includes bends, e.g. a serpentine resistor, the heat sink 210 may be configured to follow the path of the component 110.

Referring to FIG. 2B, each set of contacts 130 is illustrated as being organized in an approximately linear manner, with a distance D from the component 110 that is about the same for each contact 130. While these aspects may be preferred in some cases for layout purposes, the scope of the disclosure encompasses those embodiments having layouts with non-uniform placement of the contacts 130 with respect to the component 110. Each set is illustrated without limitation as including five contacts 130. Each of two interconnect metal portions 220 connects one set of contacts 130. A set may be as few as one contact 130, and may extend along any portion or an entirety of the length of the component 110. While the device 200 is illustrated including the two sets, embodiments having only one set of contacts 130 and a corresponding interconnect metal portion 220 adjacent the component 110 are within the scope of the disclosure.

The contacts 130 are spaced a distance D from the edge of the component 110. In general, it is preferred that this distance be as low as allowed by design rules associated with the manufacturing technology used to form the device 200. When the distance D is greater, more heat may escape into upper layers of the dielectric 125, thereby forming a parallel conduction path that competes with the desired conduction path to the substrate 105. When the distance D is minimized, the effect of competing heat conduction is reduced.

Figure 3:
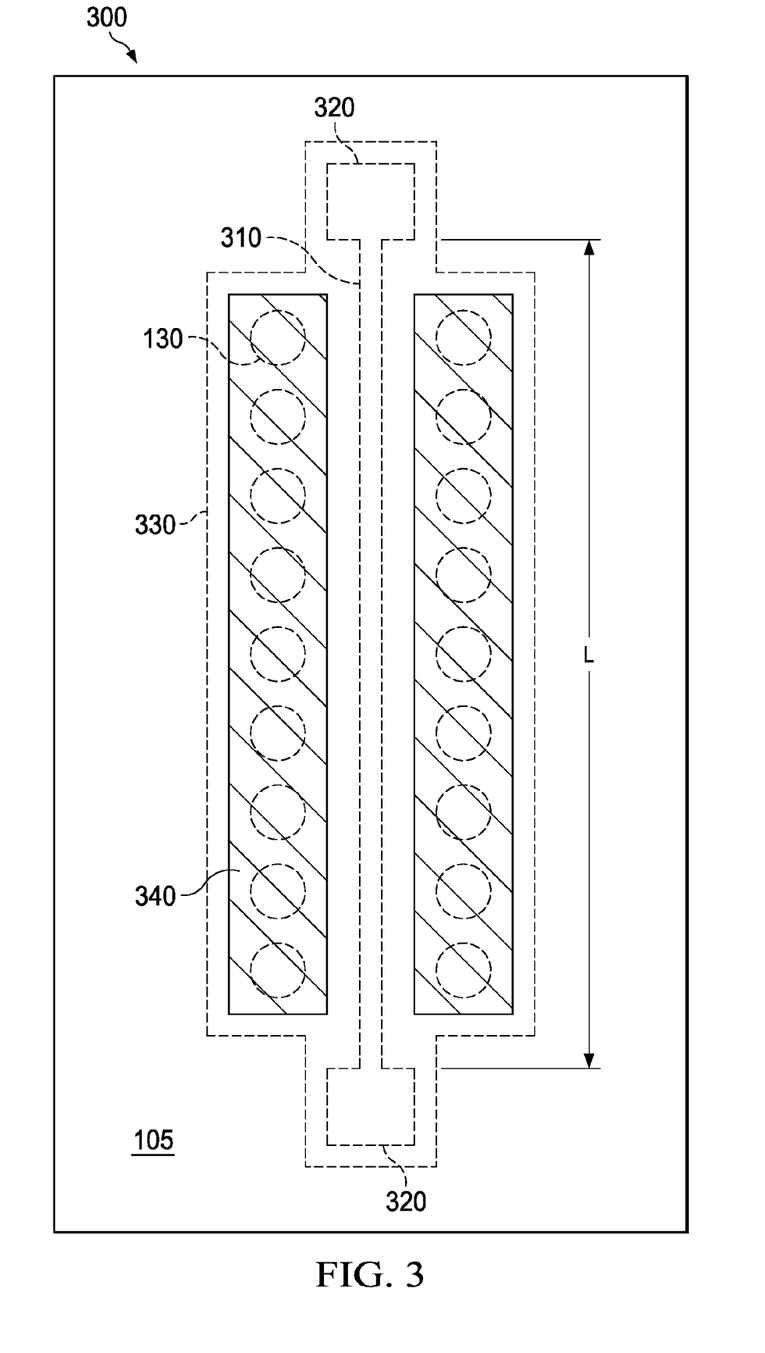
FIG. 3 is a top view of a heat dissipating component and associated heat sink.

FIG. 3 illustrates an embodiment of a heat-dissipating component of the disclosure, generally designated component 300. The component 110 is shown without limitation as a resistor. The component 300 includes a resistive path 310 and two contact pads 320. The resistive path 310 and the contact pads 320 are located over an isolation trench 330. Contact regions, e.g., diffusion wells, (not shown) are bounded by the isolation trench 330. Interconnect metal portions 340 are located over the contact regions. A row of contacts 130 extends adjacent to both sides of the resistive path 310 for substantially an entirety of the length L. Without limitation the component 300 is shown having a straight resistive path 310. In other embodiments, the contacts 130 may be formed only along a portion of the resistive path 310, or only adjacent one side of the resistive path 310. Such embodiments may be preferred in some cases, e.g., to meet signal routing requirements.

Figure 4A:
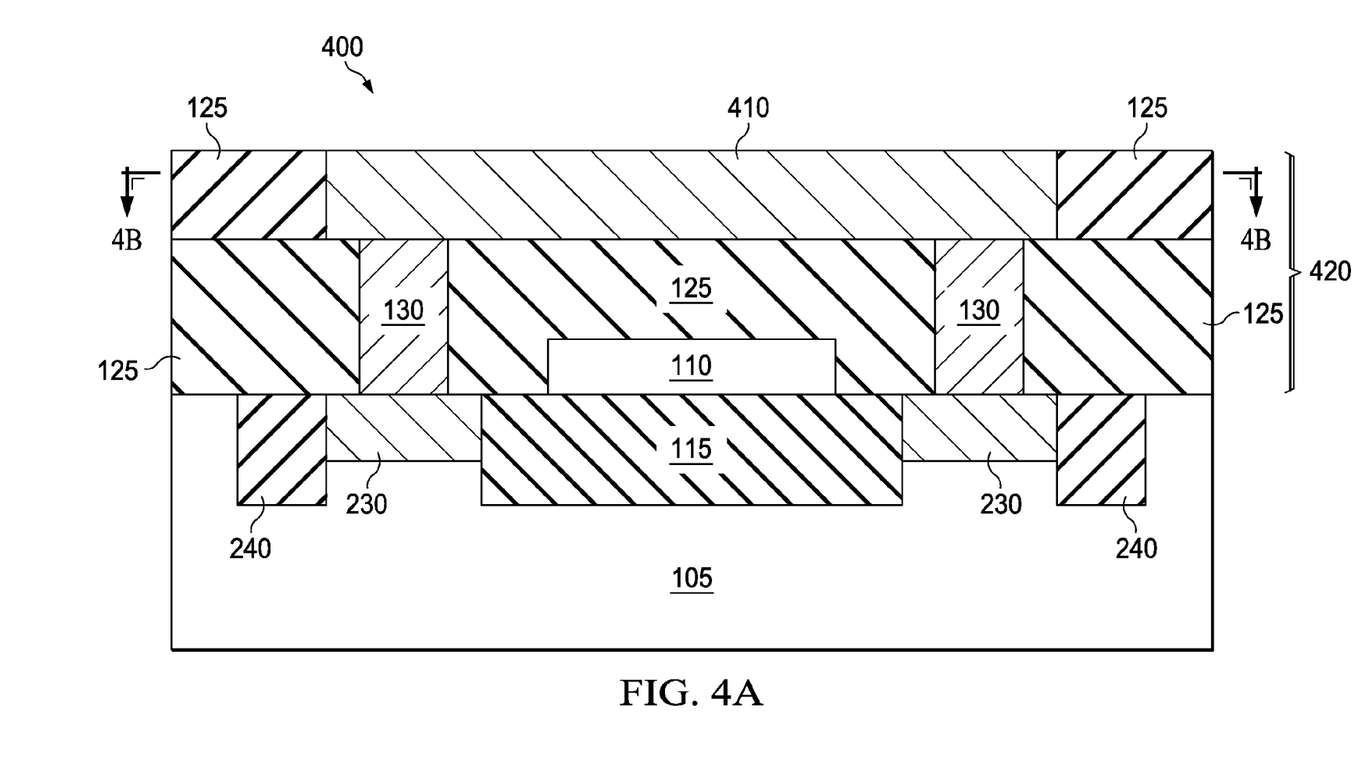
FIGS. 4A and 4B are front and top views, respectively, of an embodiment of the disclosure having a metal plate located over a component.
Figure 4B:
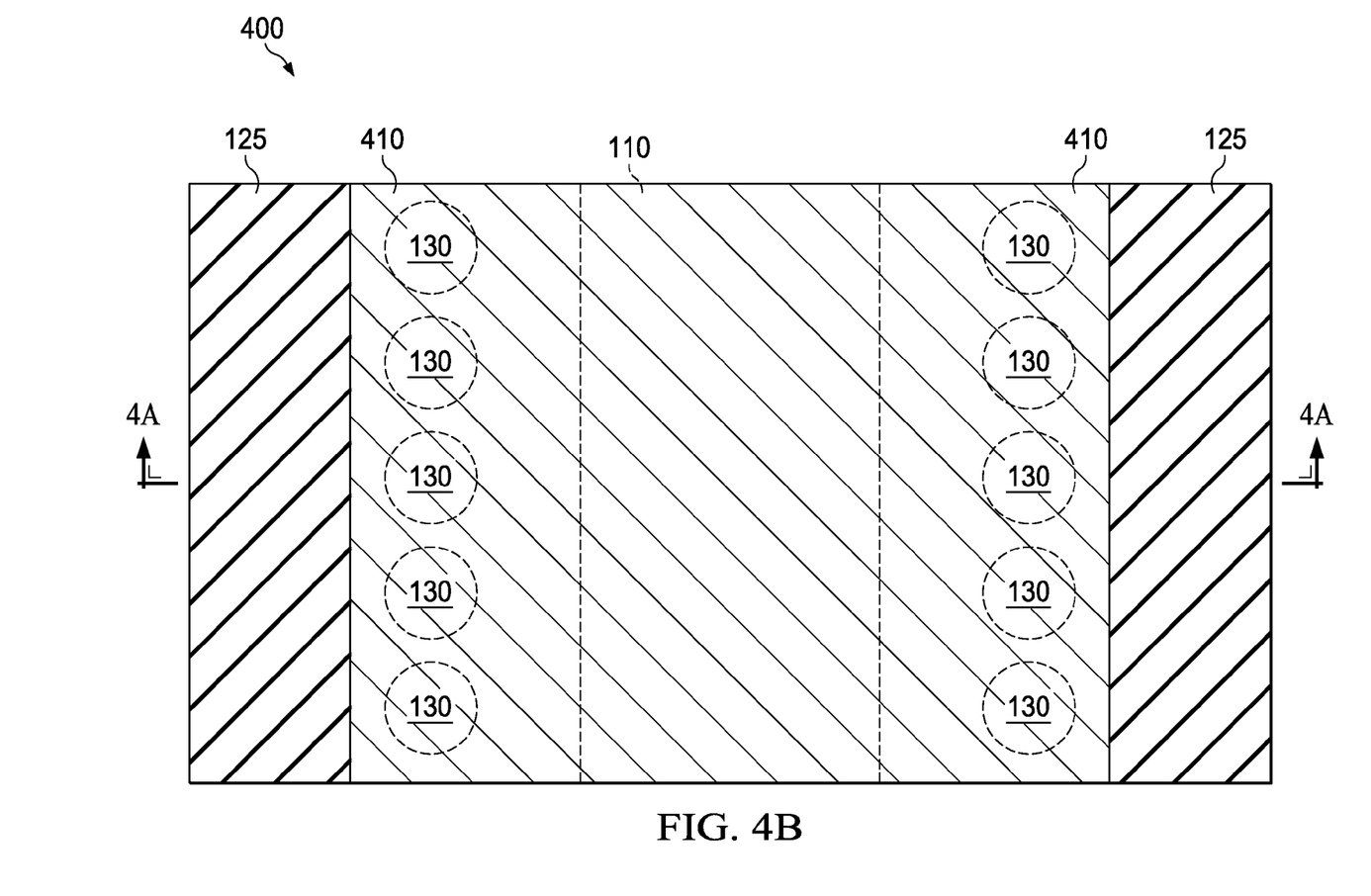

Turning to FIGS. 4A and 4B, illustrated are front top views, respectively, of an embodiment of the disclosure generally designated a device 400. A metal plate 410 is illustrated located over the component 110. The contacts 130 connect the metal plate 410 to the contact regions 230. A heat sink 420 comprises the metal plate 410 and the contacts 130. The metal plate 410 is illustrated without limitation as having no openings. However, in some embodiments, the metal plate 410 may include various openings. For example, some openings may be needed to meet design rule requirements, such as openings to reduce dishing in the case of copper CMP. Of course, other configurations that provide thermal conductivity to the contacts 130 may be used as an alternative to, or in addition to a solid metal plate 410. In some embodiments, for example, the metal plate 410 may be combined with one or more separate metal lines connecting pairs of contacts 130 disposed on opposite side of the component 110. In other embodiments, the metal plate 410 may resemble a mesh, in which a plurality of openings is present in the metal plate 410. These examples are not exhaustive of the configurations within the scope of the disclosure that may be used to realize the described benefits of the disclosed heat sinks.

Figure 5:
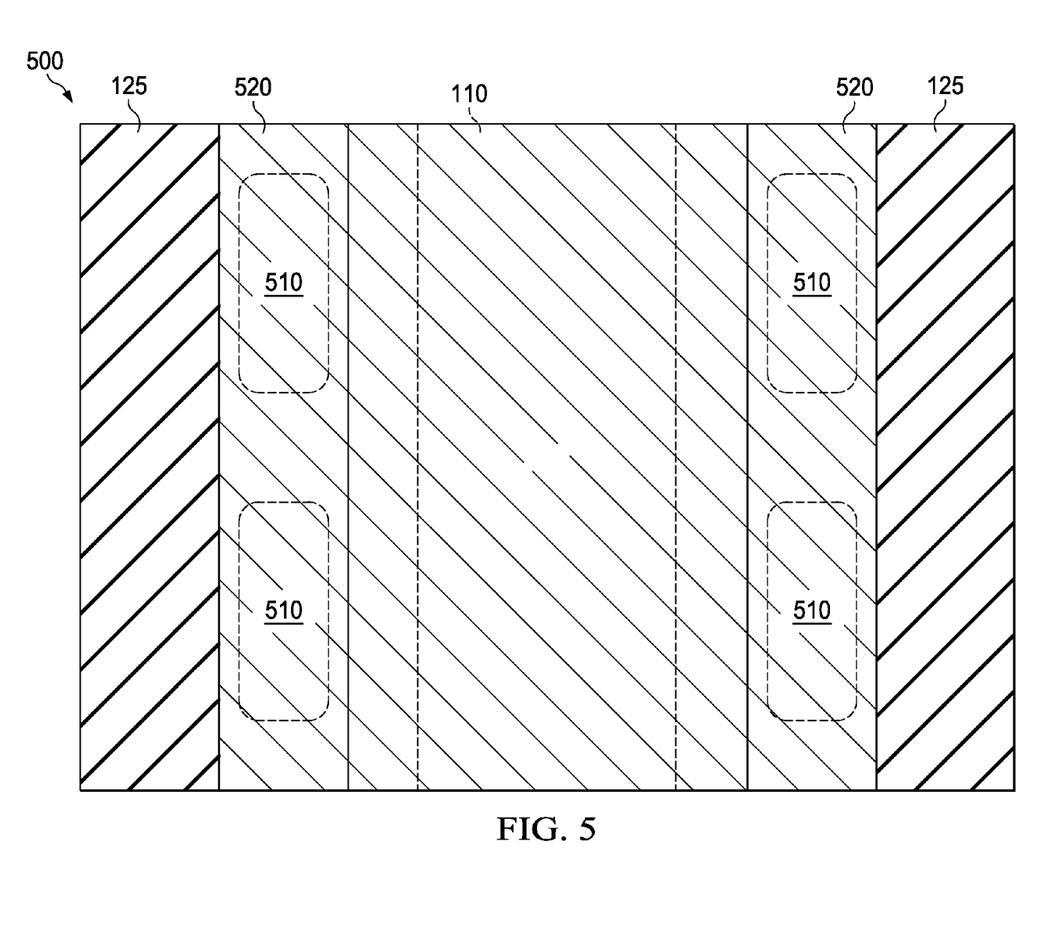
FIG. 5 is a top view of an embodiment of the disclosure having rectangular contacts.

Turning now to FIG. 5, illustrated is a top view of an embodiment generally designated device 500. The view is taken, e.g., through the same level as FIG. 4B. The component 110 is interposed between two sets of rectangular contacts 510. Interconnect metal portions 520 connect each set of rectangular contacts 510. The interconnect metal portions 520 may be, e.g., individual lines as illustrated or may be a plate connecting both sets of rectangular contacts 510 as described previously.

A rectangular contact may be formed in an opening in the dielectric 125 that has two axes of different length. In some cases, rectangular contacts have a length/width ratio of greater of about 3:1. At the limit, a continuous trench may be used where design rules allow, or where a design rule exception is permissible. The use of the rectangular contacts 510 allows a greater portion of the length L (see FIG. 3, e.g.) of a resistive path to include vertical metal structures to provide a low thermal resistance path to the substrate 105. When the rectangular contacts 510 are only used for thermal conductivity, and not electrical conductivity, design rule constraints may be relaxed in some cases as electrical yield of the rectangular contacts 510 is not critical. In such cases, allowing rectangular contacts or trenches that the design rules would not ordinarily permit may be used.

Figure 6:
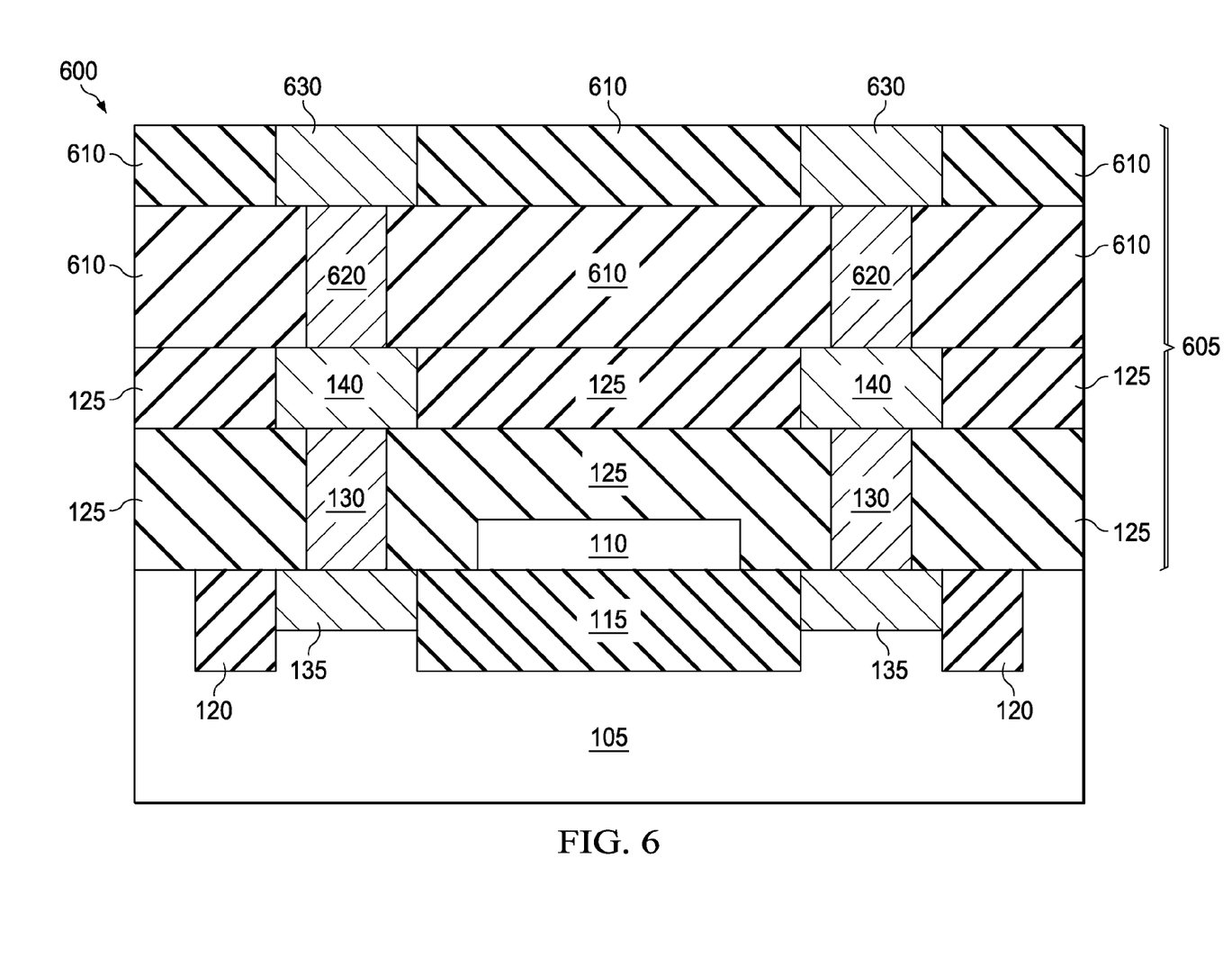
FIG. 6 is a front view of an embodiment having a heat sink that use two interconnect levels.

FIG. 6 illustrates an embodiment generally designated 600. In this embodiment, a heat sink 605 includes a second level of metallization. Dielectric layers 610 are located over the dielectric 125. Vias 620 connect interconnect metal portions 630 to the interconnect metal portions 140. Herein a via is distinguished from a contact in that a via connects two interconnect metal levels, while a contact connects an interconnect metal level to an underlying semiconductor substrate. The vias 620 may be formed from, e.g., copper, aluminum or tungsten, depending on the manufacturing technology used. The vias 620 may be any combination of cylindrical or rectangular vias, or may be a trench via. The interconnect metal portions 140, 630 may be any combination of lines or plates as described previously.

The combined metal features of the heat sink 605 form a two-level thermally conductive fence. In some cases, it may be determined that a two-level structure more effectively captures heat generated by the component 110 and conducts the heat to the substrate 105. For example, a component 110 that generates sufficient heat may overwhelm the ability of a single level of metal to conduct the heat to the substrate 105. In such a case, the interconnect metal portions 140, e.g., may not have sufficient thermal conductivity to remain near the temperature of the substrate 105, and may radiate heat to higher levels of the interconnect stack. In other embodiments, the heat sink 605 may be extended to higher levels of the interconnect structure. Those of ordinary skill will recognize that such embodiments are within the scope of the disclosure.

Figure 7:
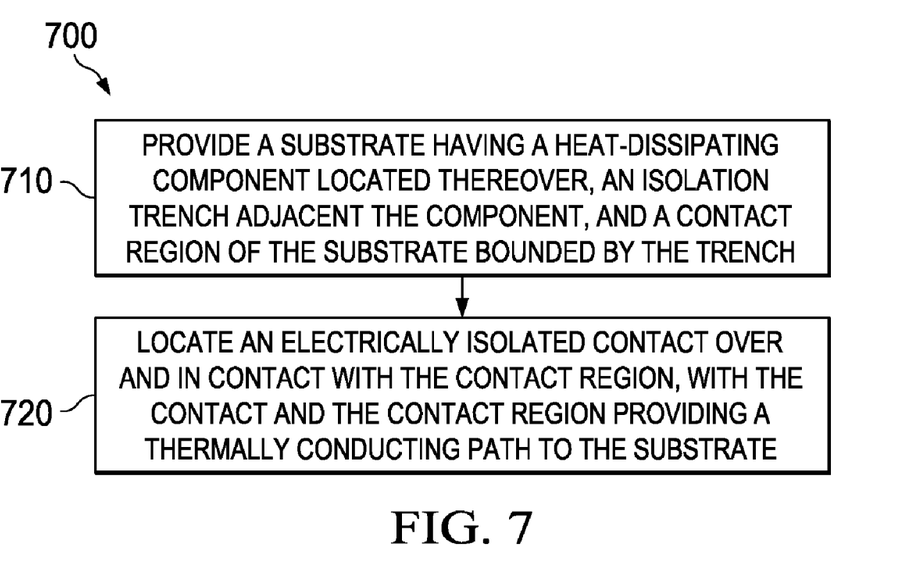
FIG. 7 illustrates a method.

Turning to FIG. 7, illustrated is a method 700 of the disclosure. In a step 710, a substrate is provided that has a heat-dissipating component located thereover. Herein and in the claims, a component formed entirely or partially in the substrate, e.g., a diffused region of an active device, is regarded as being located over the substrate. A first isolation trench is located adjacent the component, and a first contact region of the substrate, e.g., a diffusion well, is bounded by the trench. Herein, "provided" means that a device, substrate, structural element, etc., may be manufactured by the individual or business entity performing the disclosed methods, or obtained thereby from a source other than the individual or entity, including another individual or business entity.

In a step 720, an electrically isolated contact is located over and in contact with the contact region. The contact may be, e.g., an aluminum or tungsten plug formed by a conventional process as previously described. The contact and the contact region provide a thermally conducting path to the substrate.

In some embodiments of the method 700, an interconnect metal portion is located over the contact region, with the electrically isolated contact located between the interconnect metal portion and the contact region. The electrically isolated contact provides a thermally conductive path from the interconnect metal portion to the contact region.

In some embodiments, a second isolation trench is located adjacent the component. A second contact region, e.g., a second diffusion well, is formed in the substrate and is bounded by the second isolation trench. The component is interposed between the first and the second contact regions. A second contact is formed that is located over and in contact with the second contact region. In some embodiments, a second interconnect metal portion is located over the second contact region such that the second contact is located between the second interconnect metal portion and the second contact region. Optionally, the first and second interconnect metal portions are a same metal interconnect portion.

Those skilled in the art to which this application relates will appreciate that other and further additions, deletions, substitutions and modifications may be made to the described embodiments.

What is claimed is:

1. An electronic device, comprising:
   a heat dissipating component located over a substrate;
   an isolation trench formed in said substrate adjacent said component;
   a contact region of said substrate bounded by said trench; and
   an electrically isolated contact located over and in connected to said contact region, said electrically isolated contact and said contact region providing a thermally conductive path to the substrate.

2. The device of claim 1, further comprising an electrically isolated interconnect metal portion located over said contact region, wherein said electrically isolated contact is located between said interconnect metal portion and said contact region, said electrically isolated contact providing a thermally conductive path from said interconnect metal portion to said contact region.

3. The device of claim 1, wherein said isolation trench is a first isolation trench, said contact region is a first contact region, and said electrically isolated contact is a first electrically isolated contact, and further comprising:
   a second isolation trench located adjacent said component;
   a second contact region bounded by said second isolation trench; and
   a second electrically isolated contact connected to said second contact region,
   wherein said component is interposed between said first and second contact regions.

4. The device of claim 3, further comprising a first interconnect metal portion located over said first contact region and a second interconnect metal portion located over said second contact region, wherein said first contact is located between said first interconnect metal portion and said first contact region, and said second contact is located between said second interconnect metal portion and said second contact region.

5. The device of claim 4, wherein said first and said second interconnect metal portions are a same interconnect metal portion.

6. The device of claim 1, further comprising a via conductively coupled to said electrically isolated contact.

7. The device of claim 1, wherein said electrically isolated contact is one of a plurality of electrically isolated contacts connected to said contact region.

8. The device of claim 7, wherein said plurality of electrically isolated contacts is connected to a same interconnect metal portion.

9. The device of claim 1, wherein said trench completely surrounds said contact region.

10. The device of claim 1, wherein said component is a resistor.

11. A method of forming an electronic device, comprising:
    providing a substrate having a heat-dissipating component located thereover, an isolation trench adjacent said component, and a contact region of the substrate bounded by said trench; and
    locating an electrically isolated contact over and in contact with said contact region, said contact and said contact region providing a thermally conducting path to said substrate.

12. The method of claim 11, further comprising locating an interconnect metal portion over said contact region, wherein said electrically isolated contact is located between said interconnect metal portion and said contact region, said electrically isolated contact providing a thermally conductive path from said interconnect metal portion to said contact region.

13. The method of claim 11, wherein said isolation trench is a first isolation trench, said contact region is a first contact region, and said electrically isolated contact is a first electrically isolated contact, and further comprising:
    locating a second isolation trench adjacent said component, the second isolation trench bounding a second contact region, wherein said component is interposed between said first and second contact regions; and
    locating a second contact over and in contact with said second contact region.

14. The method of claim 13, further comprising locating a first interconnect metal portion over said first contact region and locating a second interconnect metal portion over said second contact region, such that said first contact is located between said first interconnect metal portion and said first contact region, and said second contact is located between said second interconnect metal portion and said second contact region.

15. The method of claim 14, wherein said first and said second interconnect metal portions are a same interconnect metal portion.

16. The method of claim 11, further comprising forming a via that is conductively coupled to said electrically isolated contact.

17. The method of claim 11, wherein said electrically isolated contact is one of a plurality of electrically isolated contacts each located adjacent said component.

18. The method of claim 17, wherein said plurality of electrically isolated contacts is connected to a same interconnect metal portion.

19. The method of claim 11, wherein said trench completely surrounds said contact region.

20. The method of claim 11, wherein said component is a resistor.

* * * * *